United States Patent
Tung et al.

(10) Patent No.: US 9,921,493 B2
(45) Date of Patent: Mar. 20, 2018

(54) PHOTOLITHOGRAPHY SYSTEM, METHOD FOR TRANSPORTING PHOTO-MASK AND UNIT THEREIN

(71) Applicant: TAIWAN SEMICONDUCTOR MANUFACTURING CO., LTD., Hsinchu (TW)

(72) Inventors: Chi-Feng Tung, Miaoli County (TW); Hsiang-Yin Shen, Hsinchu (TW); Mao-Lin Kao, Miaoli County (TW); Chih-Cheng Hsiao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 375 days.

(21) Appl. No.: 14/080,501

(22) Filed: Nov. 14, 2013

(65) Prior Publication Data

US 2015/0131070 A1 May 14, 2015

(51) Int. Cl.
*H01L 21/677* (2006.01)
*G03F 7/20* (2006.01)

(52) U.S. Cl.
CPC .... *G03F 7/70741* (2013.01); *H01L 21/67721* (2013.01); *H01L 21/67733* (2013.01); *H01L 21/67736* (2013.01)

(58) Field of Classification Search
CPC ......... H01L 21/67733; H01L 21/67736; H01L 21/67721; H01L 21/6773
See application file for complete search history.

(56) References Cited

U.S. PATENT DOCUMENTS

| | | | | |
|---|---|---|---|---|
| 4,836,111 A | * | 6/1989 | Kaufmann | B23Q 1/26 104/247 |
| 6,604,624 B2 | * | 8/2003 | Hirata | H01L 21/67706 198/494 |
| 6,702,099 B2 | * | 3/2004 | Otaguro | H01L 21/67706 198/346.3 |
| 6,709,225 B1 | * | 3/2004 | Pitts | H01L 21/67766 414/267 |
| 6,832,680 B1 | * | 12/2004 | Matsumura | H01L 21/67706 198/495 |
| 7,370,768 B2 | * | 5/2008 | Chattey | B66C 19/002 212/270 |
| 7,591,624 B2 | * | 9/2009 | Campbell | H01L 21/67276 414/217 |

(Continued)

FOREIGN PATENT DOCUMENTS

| | | | | |
|---|---|---|---|---|
| DE | 19921246 A1 | * | 11/2000 | ....... H01L 21/67733 |
| KR | 456006 Y1 | * | 10/2011 | ............. B66C 19/02 |

*Primary Examiner* — James Keenan
(74) *Attorney, Agent, or Firm* — McDermott Will & Emery LLP

(57) ABSTRACT

A photolithography system includes a photo-mask storage, at least one photolithography machine and an overhead crane for transporting at least one photo-mask at least between the photo-mask storage and the photolithography machine. The overhead crane includes at least one main rail, a mask girder, a mask hoist and a mask holding device. The mask girder is coupled with the main rail and movable at least between a first position above the photo-mask storage and a second position above the photolithography machine. The mask hoist is movably coupled with the mask girder. The mask holding device is coupled with the mask hoist.

20 Claims, 12 Drawing Sheets

(56) References Cited

U.S. PATENT DOCUMENTS

| | | | | |
|---|---|---|---|---|
| 7,753,639 | B2* | 7/2010 | Hoshino | B65G 1/0457 |
| | | | | 414/270 |
| 7,780,392 | B2* | 8/2010 | Rogers | H01L 21/67769 |
| | | | | 414/267 |
| 8,915,690 | B2* | 12/2014 | Ota | H01L 21/67733 |
| | | | | 414/275 |
| 9,033,638 | B2* | 5/2015 | Gifford | B65G 1/12 |
| | | | | 414/217 |
| 2005/0158152 | A1* | 7/2005 | Otaguro | H01L 21/67727 |
| | | | | 414/217 |
| 2009/0321219 | A1* | 12/2009 | Wada | B65G 1/04 |
| | | | | 198/341.01 |
| 2012/0109364 | A1* | 5/2012 | Harada | H01L 21/67276 |
| | | | | 700/230 |
| 2012/0199065 | A1* | 8/2012 | Wieting | H01L 21/67173 |
| | | | | 118/704 |
| 2013/0259617 | A1* | 10/2013 | Wang | B65G 1/0464 |
| | | | | 414/561 |
| 2014/0098354 | A1* | 4/2014 | Chang | H01L 21/67733 |
| | | | | 355/53 |

* cited by examiner

PHOTOLITHOGRAPHY SYSTEM, METHOD FOR TRANSPORTING PHOTO-MASK AND UNIT THEREIN

BACKGROUND

In semiconductor manufacture, photolithography is a process that produces circuit patterns on a surface of a wafer using light-sensitive photoresist and controlled exposure to light. A photo-mask allows the circuit patterns transferred to the wafer by the exposure and development process.

The photo-mask is manually transported into the photolithography machine for exposure. This manual transportation causes considerable vibrations to the photo-mask, which may hurt the photo-mask.

DETAILED DESCRIPTION

Figure 1A:
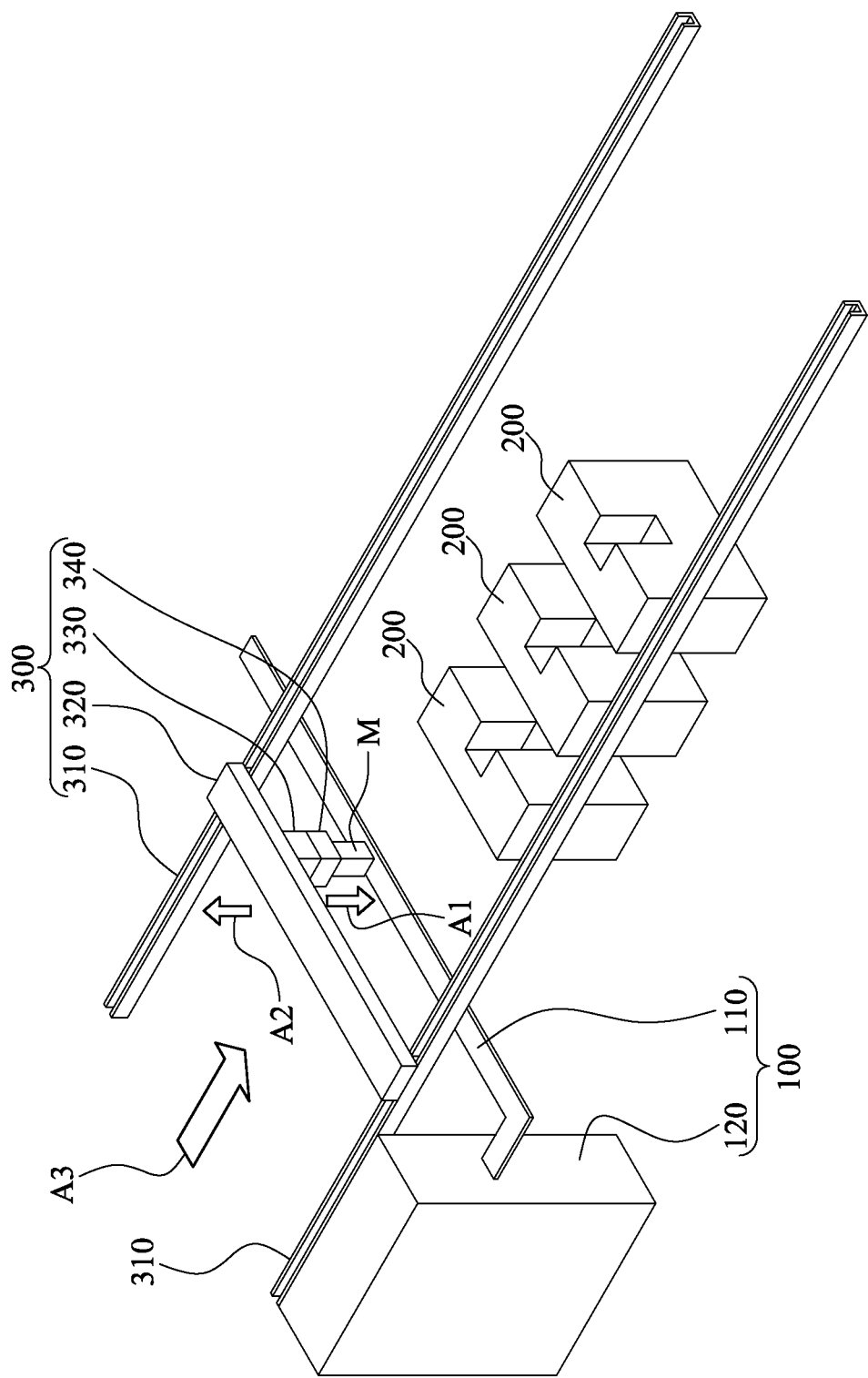
FIGS. 1A to 1D are schematic views of steps of for transporting at least one photo-mask in a photolithography system according to some embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In photolithography, the photo-mask (or called the reticle) includes a pattern thereon. The pattern can be transferred to a subject, or more specific a wafer, by exposure and development to the photoresist material on the subject. To perform the exposure process, the photo-mask is transported from a photo-mask storage to a photolithography machine, such as a scanner. FIGS. 1A to 1D are schematic views of steps of for transporting at least one photo-mask M in a photolithography system according to some embodiments of the present disclosure. As shown in FIG. 1A, the system includes a photo-mask storage 100, at least one photolithography machine 200 and an overhead crane 300. The overhead crane 300 is configured for transporting at least one photo-mask M at least between the photo-mask storage 100 and the photolithography machine 200. In other words, the overhead crane 300 is movable along a direction across the photo-mask storage 100 and the photolithography machine 200, and can take the photo-mask M from one of the photo-mask storage 100 and the photolithography machine 200 and put the photo-mask M to another one of the photo-mask storage 100 and the photolithography machine 200. Therefore, the photo-mask M is not transported manually, which reduces the vibration of the photo-mask M during the transportation of the photo-mask M and thereby protects the photo-mask M.

As shown in FIG. 1A, in some embodiments, the overhead crane 300 includes at least one main rail 310, a mask girder 320, a mask hoist 330 and a mask holding device 340. The mask girder 320 is coupled with the main rail 310, and it is movable at least between a first position above the photo-mask storage 100 and a second position above the photolithography machine 200. The mask hoist 330 is movably coupled with the mask girder 320. The mask holding device 340 is coupled with the mask hoist 330. When the overhead crane 300 is in use, the mask girder 320 can move to the first position above the mask storage 100 or the second position above the photolithography machine 200, and then, the mask hoist 330 can lift or lower the mask holding device 340. When the mask holding device 340 is lowered, it can hold or release the photo-mask M.

As shown in FIG. 1A, in some embodiments, a rated load of the combination of the mask girder 320, the mask hoist 330, and the mask holding device 340 is greater than the photo-mask M, so as to lift the photo-mask M. As such, the overhead crane 300 can securely hold the photo-mask M and transport it between the photo-mask storage 100 and the photolithography machine 200.

As shown in FIG. 1A, in some embodiments, the photo-mask storage 100 includes a conveyor 110 and a photo-mask stocker 120. The photo-mask stocker 120 stores at least one photo-mask M therein. The conveyor 110 is connected to the photo-mask stocker 120, and part of the conveyor 110 is positioned below the overhead crane 300 in order to convey the photo-mask M between the photo-mask stocker 120 and the position below the overhead crane 300. For example, a pair of main rails 310 is provided, and the mask girder 320 is positioned across the main rails 310 and movable along the main rails 310. Part of the conveyor 110 is positioned below the gap between the main rails 310. In such a configuration, the mask girder 320 can arrive at the position above the conveyor 110 to take the photo-mask M from the conveyor 110 or to put the photo-mask M onto the conveyor 110.

As shown in FIG. 1A, in some embodiments, the main rail 310 is linear. Because the mask girder 320 is movably coupled with the linear main rail 310, the mask girder 320 can move along a substantial straight line between the photo-mask storage 100 and the photolithography machine 200. In other words, the path that the mask girder 320 moves between the photo-mask storage 100 and the photolithography machine 200 is a substantial straight line.

Figure 1B:
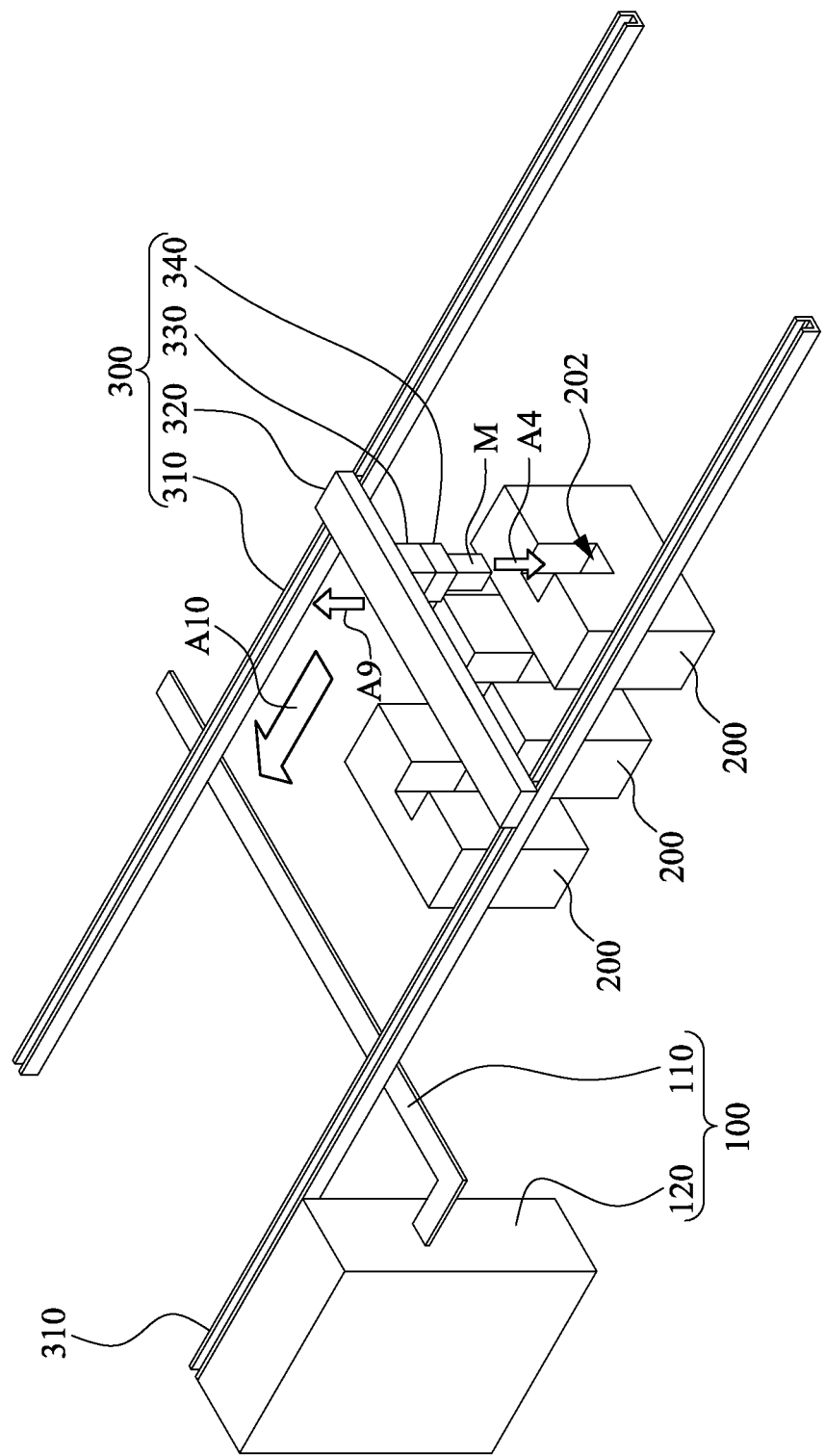
Figure 1C:
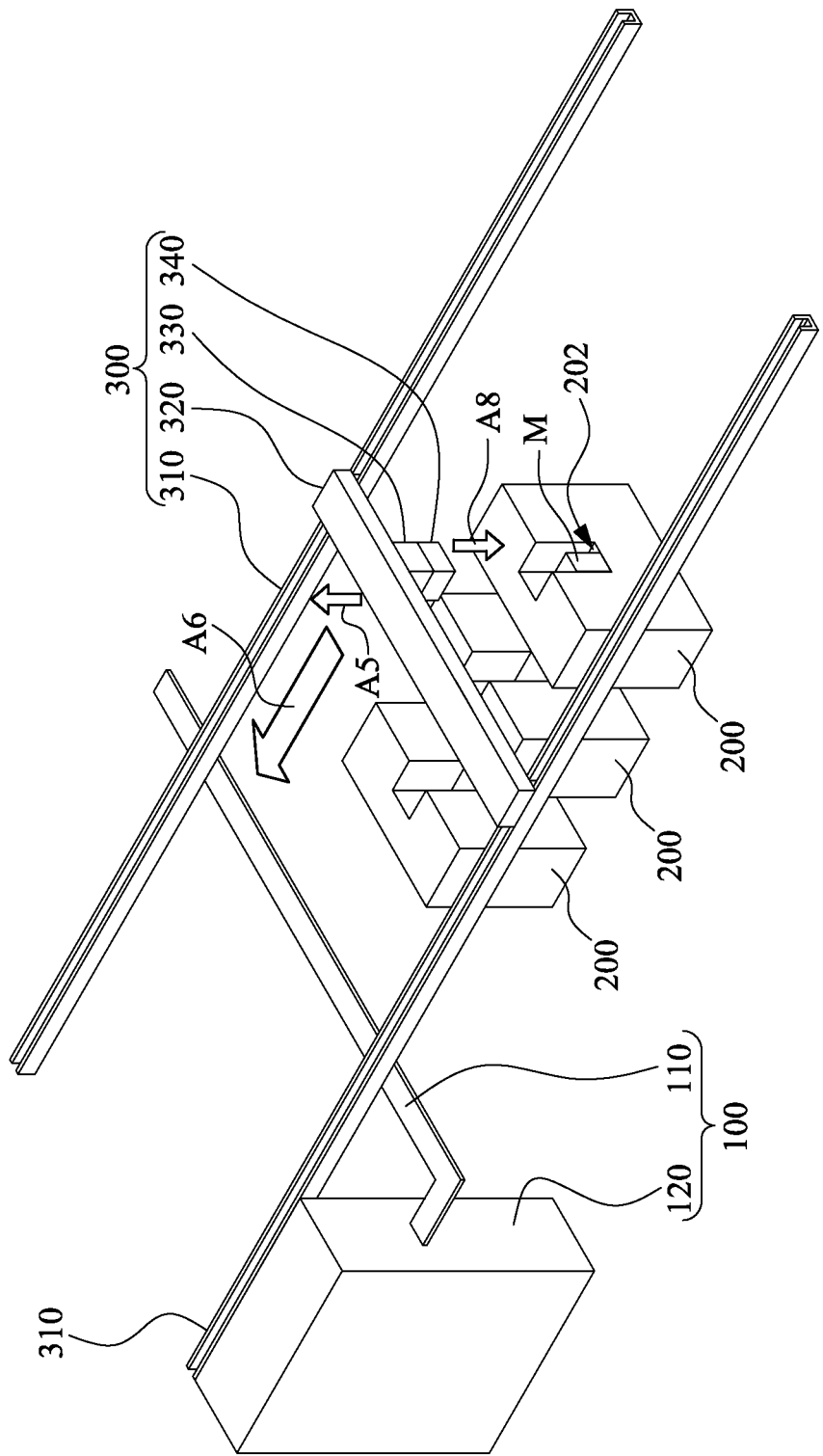
Figure 1D:
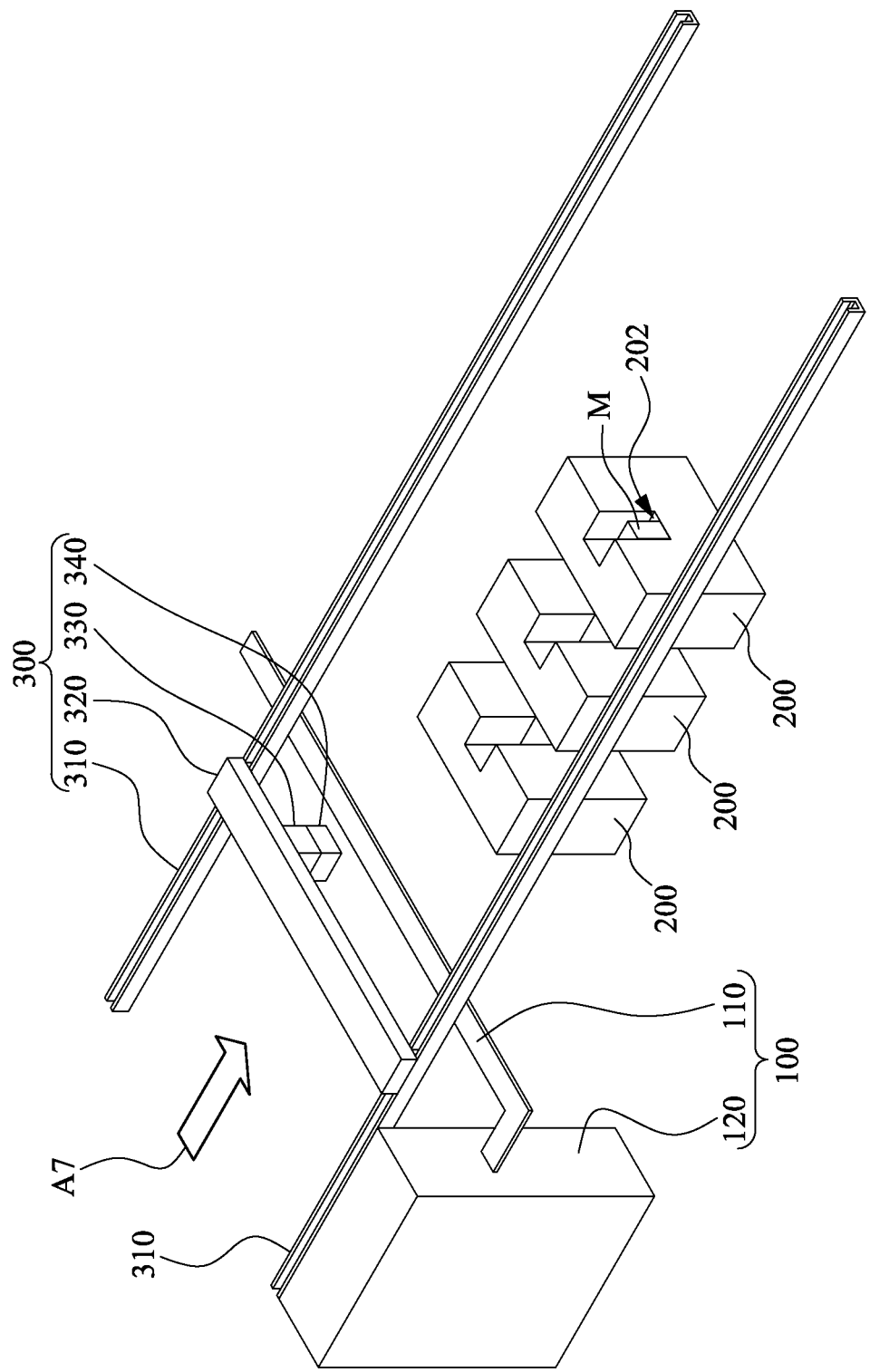
Figure 2:
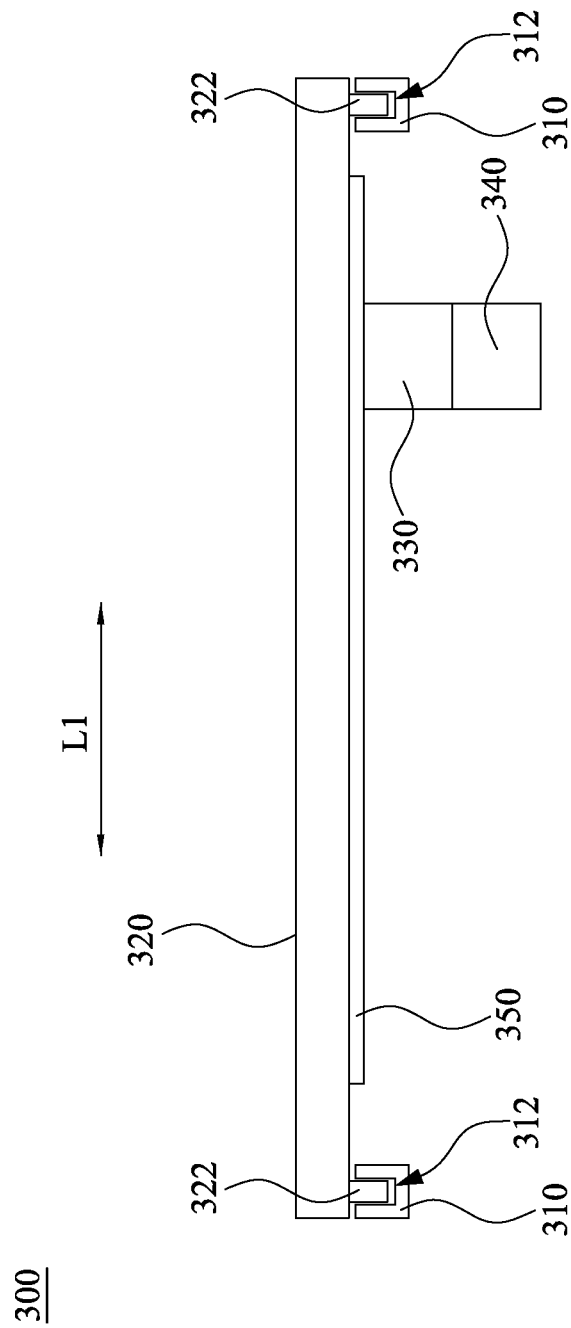
FIG. 2 is a front view of the overhead crane in FIGS. 1A to 1D.

FIG. 2 is a front view of the overhead crane 300 in FIGS. 1A to 1D. As shown in FIG. 2, the mask girder 320 has a mask girder rail 350. The mask girder rail 350 has a lengthwise direction L1 across the main rails 310. In other words, the mask girder rail 350 is positioned between the main rails 310, and the lengthwise direction L1 crosses the main rails 310. The mask hoist 330 is coupled with the mask girder rail 350 and movable substantially along the lengthwise direction L1 of the mask girder rail 350. Stated differently, the mask hoist 330 is movably coupled with the mask girder rail 350, and the path that the mask hoist 330 moves along relative to the mask girder 320 is substantially parallel to the lengthwise direction L1 of the mask girder rail 350.

In such a configuration, the path that the mask hoist 330 moves along is not parallel the path that the mask girder 320 moves along. More particularly, because the mask girder 320 is movable along the main rails 310, and the mask hoist 330 is movable along the lengthwise direction L1 across the main rails 310, the path that the mask hoist 330 moves along relative to the mask girder 320 can be substantially orthogonal to the path that the mask girder 320 moves along. As such, the main rails 310 allow the mask girder 320 to perform one-dimensional motion (such as the motion along X axis in Cartesian coordinates system), and the mask girder rail 350 allows the mask hoist 330 to perform another one-dimensional motion (such as the motion along Y axis in Cartesian coordinates system). Furthermore, because the mask hoist 330 can lift or lower the mask holding device 340, it allows the mask holding device 340 to perform the other dimensional motion (such as the motion along Z axis in Cartesian coordinates system). Therefore, the mask holding device 340 can perform three-dimensional motion.

As shown in FIG. 2, in some embodiments, the main rail 310 includes a guiding groove 312, and the mask girder 320 includes at least one wheel 322. The wheel 322 is positioned in the guiding groove 312 and is rollable in the guiding groove 312, so that the mask girder 320 can move along the main rail 310.

Reference is now made to FIGS. 1A to 1D. The method for transporting the photo-mask M from the photo-mask storage 100 to the photolithography machine 200 is described below. In FIG. 1A, the mask girder 320 can move to the first position above the photo-mask storage 100, especially the conveyor 110. Then, the mask hoist 330 can lower the mask holding device 340 relative to the mask girder 320. For example, the mask hoist 330 can lower the mask holding device 340 along the direction A1 toward the conveyor 110. Then, the mask holding device 340 can hold the photo-mask M on the conveyor 110. After the photo-mask M is held, the mask hoist 330 can lift the mask holding device 340, so as to take the photo-mask M away from the conveyor 110. For example, the mask hoist 330 can lift the mask holding device 340 with the photo-mask M along the direction A2. Then, the mask girder 320 with the mask hoist 330, the mask holding device 340 and the photo-mask M can linearly move to a destination, such as the second position above the photolithography machine 200. For example, the mask girder 320 can linearly move along the direction A3 toward the photolithography machine 200.

In FIG. 1B, when the mask girder 320 arrives at the second position above the photolithography machine 200, the mask hoist 330 can lower the mask holding device 340 to move the photo-mask M into a mask receiving recess 202 of the photolithography machine 200. For example, when the mask holding device 340 holding the photo-mask M arrives at the position above the mask receiving recess 202, the mask hoist 330 can lower the mask holding device 340 along the direction A4. Then, the mask holding device 340 can release the photo-mask M to the photolithography machine 200, such that the photo-mask M can be put into the mask receiving recess 202. In some embodiments, the mask holding device 340 can move substantially along the lengthwise direction of the mask girder 320, namely, the direction across the main rails 310, so as to align the mask holding device 340 with the mask receiving recess 202. For example, the mask holding device 340 can move along the mask girder rail 350 (See FIG. 2).

In FIG. 1C, when the photo-mask M is released by the mask holding device 340 and is thereby put into the mask receiving recess 202, the mask hoist 330 can lift the mask holding device 340 to move it away from the mask receiving recess 202. For example, the mask hoist 330 can lift the mask holding device 340 along the direction A5 toward the mask girder 320. Then, the mask girder 320 can move away from the photolithography machine 200. For example, the mask girder 320 can move along the direction A6 toward the photo-mask storage 100. The photo-mask M can be left in the mask receiving recess 202, so that the photo-mask M is transported to the photolithography machine 200.

Then, in FIG. 1D, the mask girder 320 with the mask hoist 330 and the mask holding device 340 can move back to the first position above the mask storage 100, so as to transport the next photo-mask M.

The method for transporting the photo-mask M from the photolithography machine 200 to the photo-mask storage 100 is described below. In FIG. 1D, the photo-mask M is positioned in the mask receiving recess 202 of the photolithography machine 200. The mask girder 320 can move toward the photolithography machine 200. For example, the mask girder 320 positioned above the conveyor 110 of the mask storage 100 can linearly move along the direction A7 toward the photolithography machine 200 having the photo-mask M therein.

In FIG. 1C, when the mask girder 320 arrives at the second position above the photolithography machine 200, the mask hoist 330 can lower the mask holding device 340 relative to the mask girder 320. For example, the mask hoist 330 can lower the mask holding device 340 along the direction A8, so as to hold the photo-mask M in the mask receiving recess 202.

In FIG. 1B, when the mask holding device 340 holds the photo-mask M in the mask receiving recess 202, the mask hoist 330 can lift the mask holding device 340. For example, the mask hoist 330 can lift the mask holding device 340 along the direction A9 toward the mask girder 320. Then, the mask girder 320 can move to a destination, such as the position above the conveyor 110 of the photo-mask storage 100. For example, the mask girder 320 can linearly move along the direction A10.

In FIG. 1A, the mask hoist 330 can lower the mask holding device 340 with the photo-mask M, so as to put the photo-mask M onto the conveyor 110 of the photo-mask storage 100. For example, the mask hoist 330 can lower the mask holding device 340 along the direction A1. Then, the mask holding device 340 can release the photo-mask M to the photo-mask storage 100. For example, the mask holding device 340 can release the photo-mask M onto the conveyor 110 of the photo-mask storage 100. Then, the conveyor 110 can convey the photo-mask M to the photo-mask stocker 120.

Figure 3A:
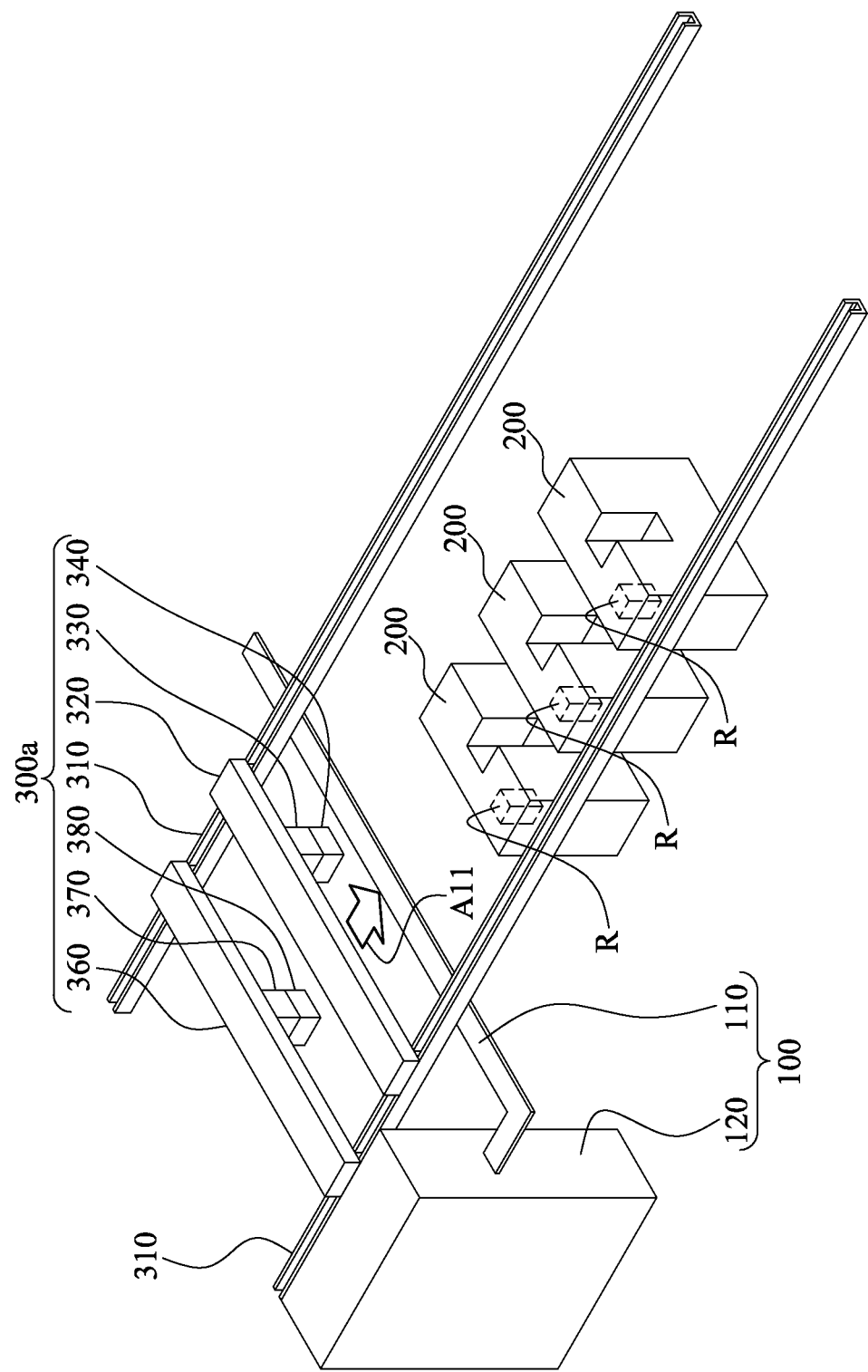
FIGS. 3A to 3F are schematic views of steps of for transporting at least one removable unit in a photolithography system according to some embodiments of the present disclosure.

In some embodiments, the photolithography machine 200 includes at least one unit therein, in which the unit is removable (or called removable unit). FIGS. 3A to 3F are schematic views of steps of for transporting at least one removable unit R in a photolithography system according to some embodiments of the present disclosure. As shown in FIG. 3A, the main difference between the overhead crane 300a and the foregoing overhead crane 300 is that the overhead crane 300a additionally includes a unit girder 360, a unit hoist 370 and a unit holding device 380 for transporting the removable unit R in the photolithography machine 200. The unit girder 360 is coupled with the main rails 310, and it is movable at least between the second position above the photolithography machine 200 and a third position. The third position deviates from the first position above the conveyor 110 of the photo-mask storage 100 and the second position above the photolithography machine 200. The unit hoist 370 is movably coupled with the unit girder 360. The unit holding device 380 is coupled with the unit hoist 370. When the overhead crane 300a is in use, the unit girder 360 can move to the second position above the photolithography machine 200, and then, the unit hoist 370 can lift or lower the unit holding device 380. When the unit holding device 380 is lowered, it can hold or release the removable unit R.

As shown in FIG. 3A, in some embodiments, a rated load of the combination of the unit girder 360, the unit hoist 370, and the unit holding device 380 is greater than the removable unit R, so as to lift the removable unit R. As such, the overhead crane 300a can securely hold the removable unit R and transport it toward or away from the photolithography machine 200.

As shown in FIG. 3A, in some embodiments, the main rails 310 are linear and parallel to each other. Because the unit girder 360 is movably coupled with the linear main rails 310, the unit girder 360 can move along a substantial straight line. In other words, the path that the unit girder 360 moves is a substantial straight line.

As shown in FIG. 3A, in some embodiments, the rated load of the combination of the unit girder 360, the unit hoist 370, and the unit holding device 380 is greater than the rated load of the combination of the mask girder 320, the mask hoist 330, and the mask holding device 340, so that unit girder 360, the unit hoist 370, and the unit holding device 380 can lift the removable unit R that is heavier than the photo-mask M (See FIG. 1A). Stated differently, in order to transport the removable unit R and the photo-mask M having different weights, the overhead crane 300a employs the mask girder 320, the mask hoist 330, and the mask holding device 340 to transport the photo-mask M lighter than the removable unit R, and employs the unit girder 360, the unit hoist 370, and the unit holding device 380 to transport the removable unit R that is heavier than the photo-mask M. The mask girder 320 and the unit girder 360 are movably coupled with the main rails 310. In such a configuration, the removable unit R and the photo-mask M can be transported along the main rails 310.

Figure 3B:
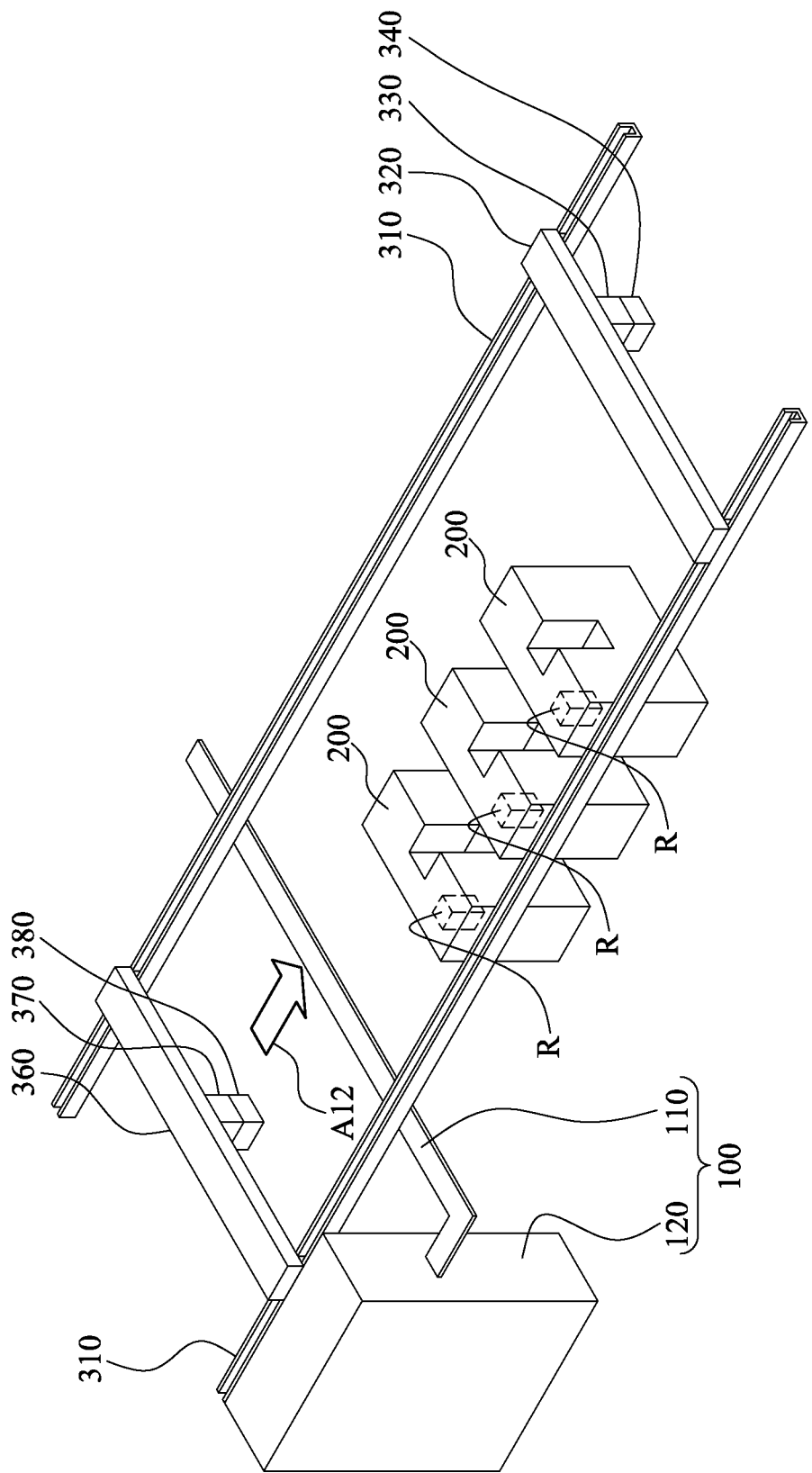
Figure 3C:
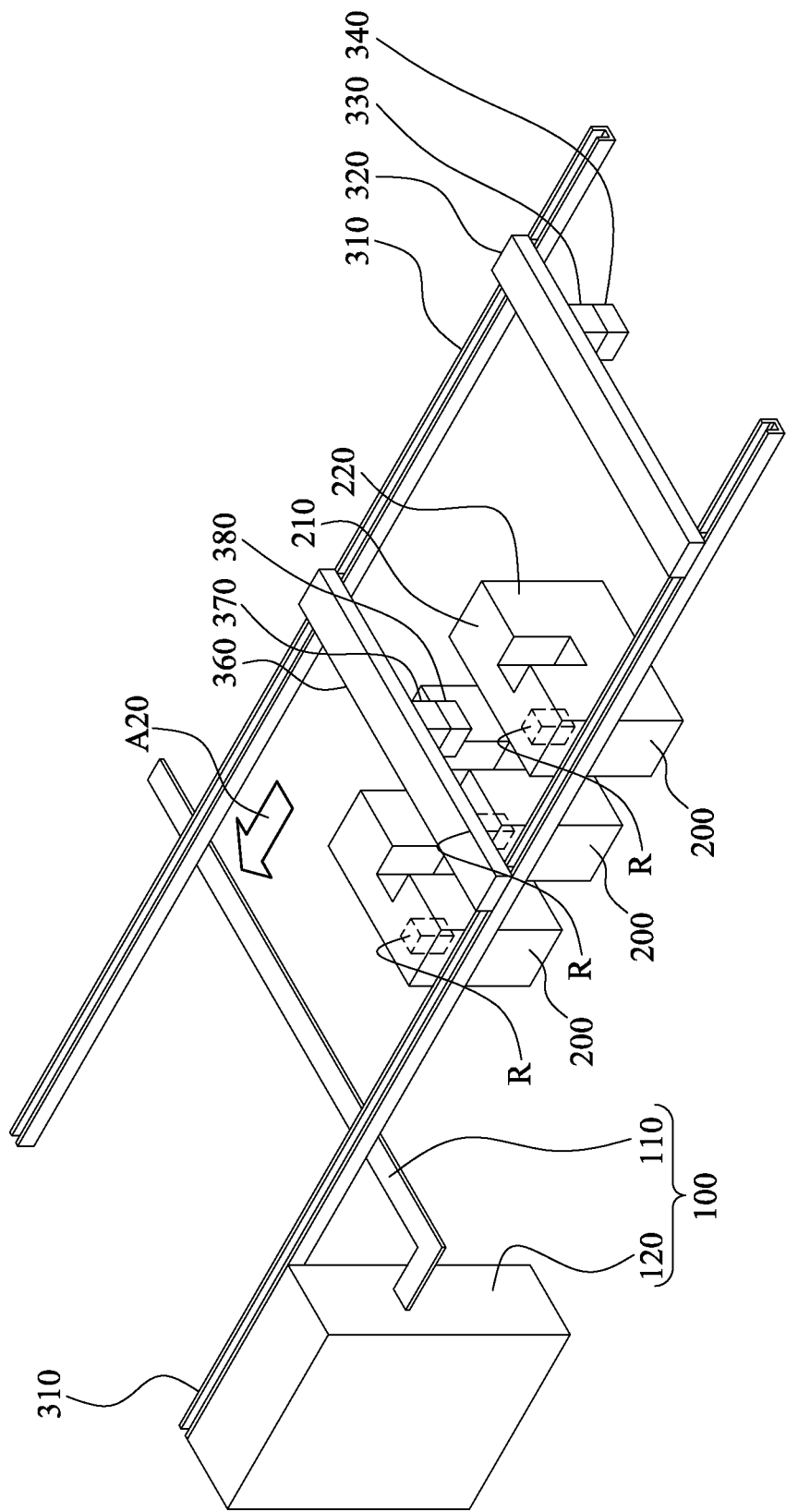
Figure 3D:
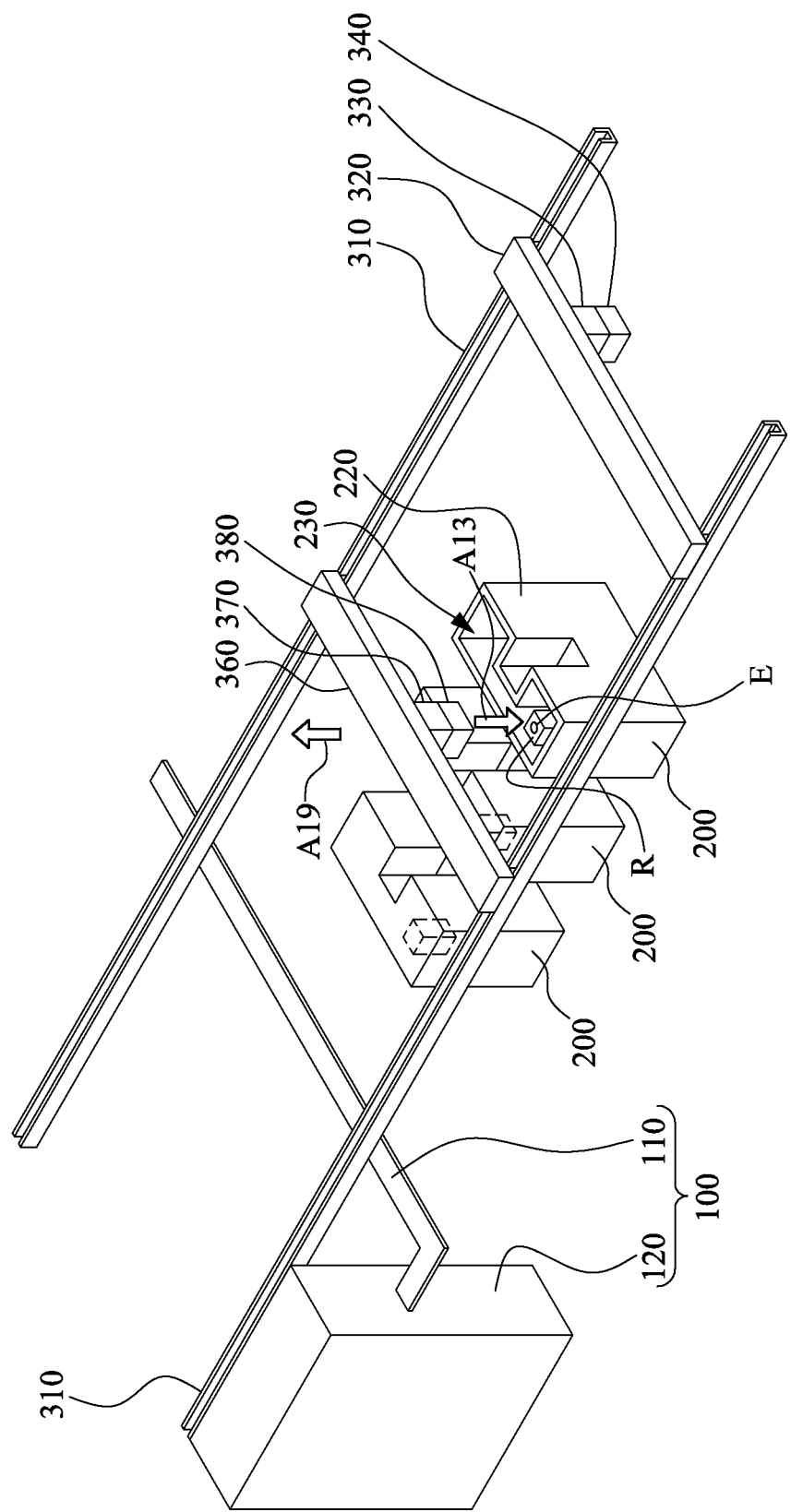

As shown in FIG. 3D, in some embodiments, the removable unit R can be, but is not limited to be, an equipment for the exposure process. For example, the removable unit R includes at least one lens E used for the exposure process. The unit girder 360, the unit hoist 370 and the unit holding device 380 can transport this equipment away from the photolithography machine 200 for repairing. In some embodiments, as shown in FIG. 3C, the photolithography machine 200 includes a cover 210 and a container 220. The cover 210 covers the container 220, and as shown in FIG. 3D, it can be removed from the container 220 to expose the inner space 230. As shown in FIG. 3D, the removable unit R is accommodated in the inner space 230. Therefore, the cover 210 can be removed to expose the inner space 230 and the removable unit R when transporting the removable unit R away from the photolithography machine 200.

Figure 3E:
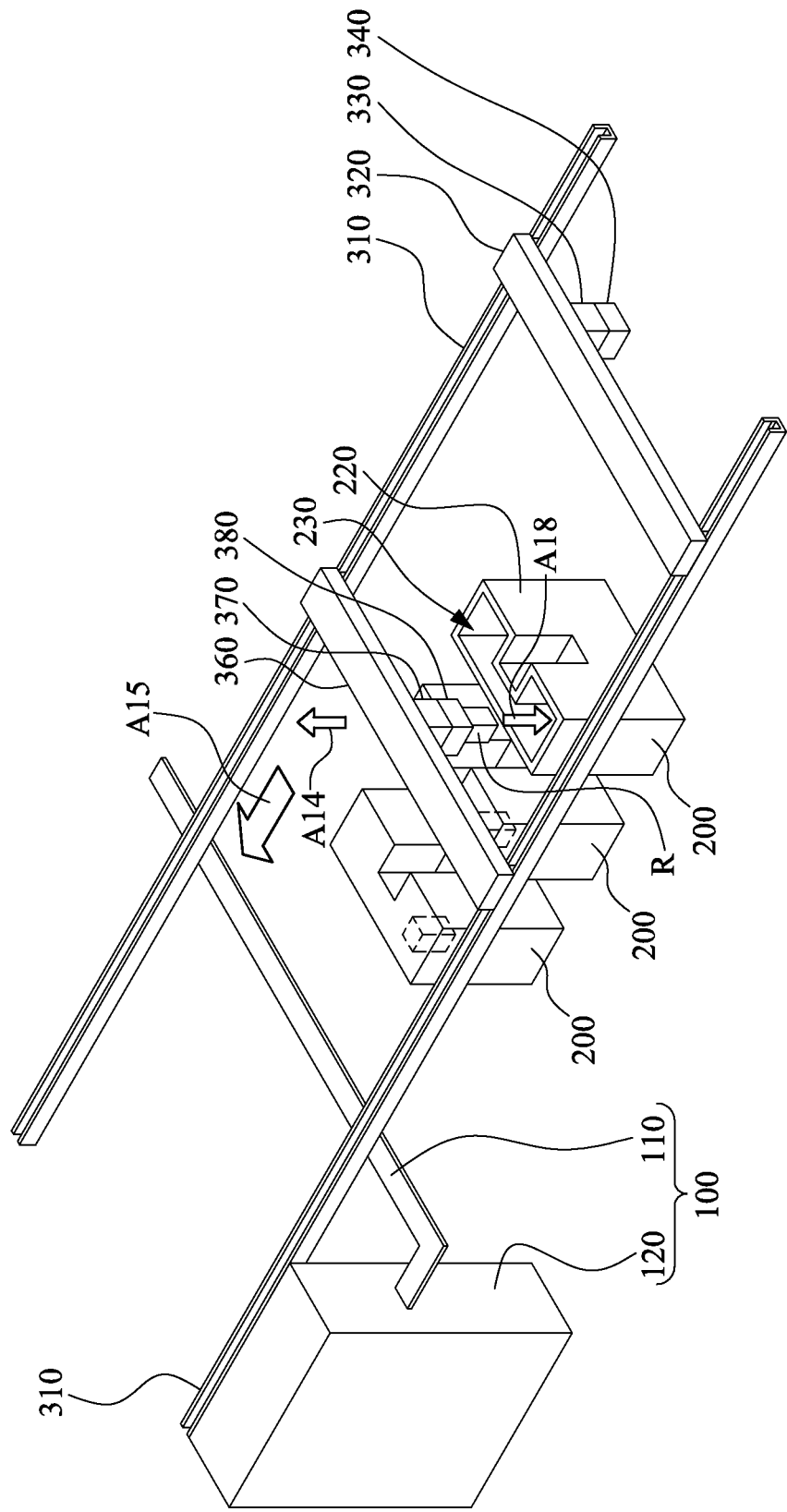
Figure 3F:
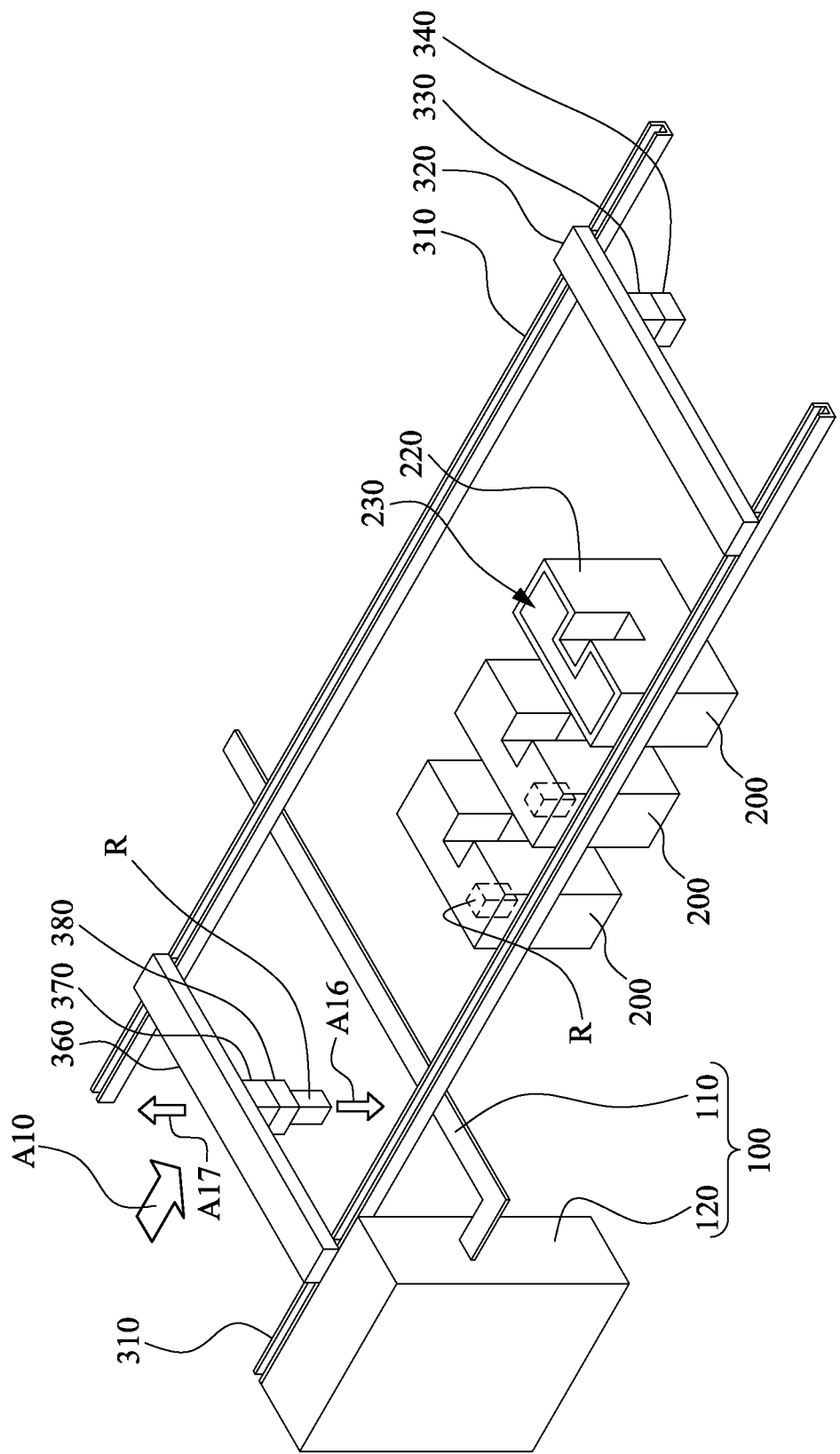
Figure 4:
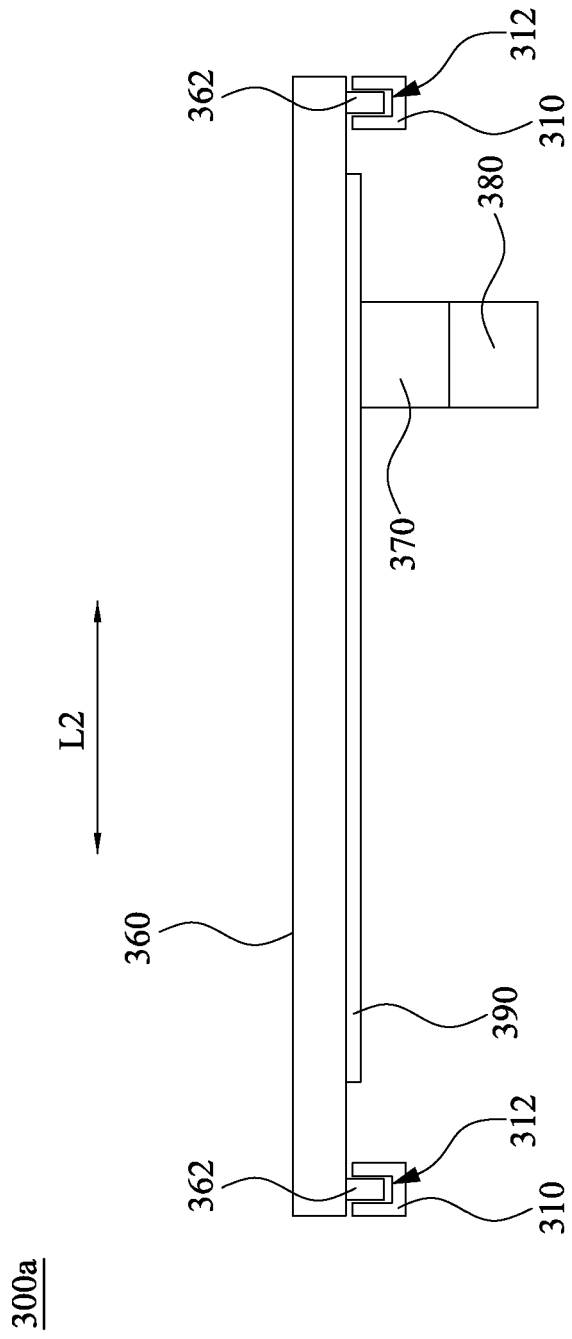
FIG. 4 is a front view of the overhead crane in FIGS. 3A to 3F.

FIG. 4 is a front view of a part of the overhead crane 300a in FIGS. 3A to 3F. As shown in FIG. 4, the unit girder 360 has a unit girder rail 390. The unit girder rail 390 has a lengthwise direction L2 across the main rails 310. In other words, the unit girder rail 390 is positioned between the main rails 310, and the lengthwise direction L2 crosses the main rails 310. The unit hoist 370 is coupled with the unit girder rail 390 and is movable substantially along the lengthwise direction L2 of the unit girder rail 390. Stated differently, the unit hoist 370 is movably coupled with the unit girder rail 390, and the path that the unit hoist 370 moves along relative to the unit girder 360 is substantially parallel to the lengthwise direction L2 of the unit girder rail 390.

In such a configuration, the path that the unit hoist 370 moves along is not parallel the path that the unit girder 360 moves along. More particularly, because the unit girder 360 is movable along the main rails 310, and the unit hoist 370 is movable along the lengthwise direction L2 across the main rails 310, the path that the unit hoist 370 moves along relative to the unit girder 360 can be substantially orthogonal to the path that the unit girder 360 moves along. As such, the main rails 310 allow the unit girder 360 to perform one-dimensional motion (such as the motion along X axis in Cartesian coordinates system), and the unit girder rail 390 allows the unit hoist 370 to perform another one-dimensional motion (such as the motion along Y axis in Cartesian coordinates system). Furthermore, because the unit hoist 370 can lift or lower the unit holding device 380, it allows the unit holding device 380 to perform the other dimensional motion (such as the motion along Z axis in Cartesian coordinates system). Therefore, the unit holding device 380 can perform three-dimensional motion.

As shown in FIG. 4, in some embodiments, the unit girder 360 includes at least one wheel 362. The wheel 362 is positioned in the guiding groove 312 and is rollable in the guiding groove 312, so that the unit girder 360 can move along the main rail 310.

Reference is now made to FIGS. 3A to 3F. The method for transporting the removable unit R away from the photolithography machine 200 is described below. In FIG. 3A, the mask girder 320 can move away from a space at least between the unit girder 360 and a stating location, especially one of the photolithography machines 200. For example, the mask girder 320 can linearly move along the direction A11 across the photolithography machines 200.

In FIG. 3B, the unit girder 360 can move to the staring location, especially the photolithography machine 200. For example, the unit girder 360 can linearly move along the direction A12 toward the photolithography machine 200.

In FIG. 3C, when the unit girder 360 arrives at the starting location, the unit girder 360 is positioned above the cover 210 of the photolithography machine 200. Then, the cover 210 can be removed.

In FIG. 3D, the inner space 230 and the removable unit R having the lens E are exposed due to the removal of the cover 210 (See FIG. 3C). Then, the unit hoist 370 can lower the unit holding device 380 relative to the unit girder 360, so as to allow the unit holding device 380 to hold the removable unit R in the inner space 230 of the photolithography machine 200. For example, the unit hoist 370 can lower the unit holding device 380 along the direction A13 toward the photolithography machine 200. Then, the unit holding device 380 holds the removable unit R in the inner space 230. In some embodiments, the unit holding device 380 can substantially move along the lengthwise direction of the unit girder 360, namely, the direction across the main rails 310, so as to align the unit holding device 380 with the removable unit R.

In FIG. 3E, the unit hoist 370 can lift the unit holding device 380, so as to move the removable unit R away from the photolithography machine 200. For example, the unit hoist 370 can lift the unit holding device 380 along the direction A14. Then, the unit girder 360 can move to a destination, such as the position deviating from the photolithography machine 200 and the conveyor 110 of the photo-mask storage 100. For example, the unit girder 360 can move along the direction A15 toward the position deviating from the photolithography machine 200 and the conveyor 110.

In FIG. 3F, when the unit girder 360 arrives at the position deviating from the photolithography machine 200 and the conveyor 110, the unit hoist 370 can lower the unit holding device 380 with the removable unit R relative to the unit girder 360. Then, the unit holding device 380 can release the removable unit R. In such a way, the removable unit R can be transported away from the photolithography machine 200 to be repaired.

The method for transporting the removable unit R to the photolithography machine 200 is described below. In FIG. 3F, the removable unit R is positioned away from the photolithography machine 200. The unit girder 360 can move to the starting location, namely, the position above the removable unit R. The unit hoist 370 can lower the unit holding device 380 to hold the removable unit R. For example, the unit hoist 370 can lower the unit holding device 380 along the direction A16. After the unit holding device 380 holds the removable unit R, the unit hoist 370 can lift the unit holding device 380 with the movable unit R. For example, the unit hoist 370 can lift the unit holding device 380 along the direction A17. Then, the unit girder 360 with the unit holding device 380 and the removable unit R can move to a destination, especially the position above the photolithography machine 200.

In FIG. 3E, when the unit girder 360 arrives at the destination, the unit hoist 370 can lower the unit holding device 380, so as to move the removable unit R into the inner space 230 of the photolithography machine 200. For example, the unit hoist 370 can lower the unit holding device 380 along the direction A18 toward the photolithography machine 200. In some embodiments, before lowering the unit holding device 380 toward the photolithography machine 200, the inner space 230 of the photolithography machine 200 is exposed in advance for allowing the removable unit R moving in.

In FIG. 3E, when the unit holding device 380 is lowered, the unit holding device 380 can release the removable unit R, so that the removable unit R can be transported to the photolithography machine 200.

In FIG. 3D, the unit hoist 370 can lift the unit holding device 380 away from the inner space 230 of the photolithography machine 200. For example, the unit hoist 370 can lift the unit holding device 380 along the direction A19 toward the unit girder 360.

In FIG. 3C, the cover 210 can be put back onto the container 220, so as to enclose the inner space 230 (See FIG. 3D). Then, the unit girder 360 can move away from the photolithography machine 200. For example, the unit girder 360 can move along the direction A20 to leave away from the photolithography machine 200.

In some embodiments, a photolithography system is disclosed that includes a photo-mask storage, at least one photolithography machine and an overhead crane for transporting at least one photo-mask at least between the photo-mask storage and the photolithography machine. The overhead crane includes at least one main rail, a mask girder, a mask hoist and a mask holding device. The mask girder is coupled with the main rail and movable at least between a first position above the photo-mask storage and a second position above the photolithography machine. The mask hoist is movably coupled with the mask girder. The mask holding device is coupled with the mask hoist.

Also disclosed is a method for transporting at least one photo-mask. The method includes the following steps. A mask holding device is lowered relative to a mask girder. The photo-mask is held by the mask holding device. The mask holding device with the photo-mask is lifted relative to the mask girder. The mask girder with the mask holding device and the photo-mask moves to a destination. The mask holding device with the photo-mask is lowered relative to the mask girder. The photo-mask is released.

Also disclosed is a method for transporting at least one unit. The method includes the following steps. A mask girder moves away from a space at least between a unit girder and a starting location. The unit girder moves to the starting location. A unit holding device is lowered relative to the unit girder. The unit is held by the unit holding device. The unit holding device with the unit is lifted relative to the unit girder. The unit girder with the unit holding device and the unit moves to a destination. The unit holding device with the unit is lowered relative to the unit girder. The unit is released.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

The term "substantially" in the whole disclosure refers to the fact that embodiments having any tiny variation or modification not affecting the essence of the technical features can be included in the scope of the present disclosure.

Reference throughout the specification to "some embodiments" means that a particular feature, structure, implementation, or characteristic described in connection with the embodiments is included in at least one embodiment of the present disclosure. Thus, uses of the phrases "in some embodiments" in various places throughout the specification are not necessarily all referring to the same embodiment. Furthermore, the particular features, structures, implementation, or characteristics may be combined in any suitable manner in one or more embodiments.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A photolithography system comprising:
   a photo-mask stocker;
   a conveyor connected to the photo-mask stocker;
   at least one main rail extending across the conveyor;
   at least one photolithography machine comprising a container and a cover over an inner space inside the container; and
   a first overhead crane for transporting at least one photo-mask at least between the conveyor and the at least one photolithography machine, the first overhead crane comprising:

a mask girder coupled with the at least one main rail and movable at least between a first position above the conveyor and a second position above the at least one photolithography machine;
a mask hoist movably coupled with the mask girder;
a mask holding device coupled with the mask hoist; and
a second overhead crane for transporting a removable unit at least between the at least one photolithography machine and a third position, the second overhead crane comprising a unit holding device movable into the inner space inside the photolithography machine when the inner space is exposed from the cover.

2. The photolithography system of claim 1, wherein the at least one main rail is linear.

3. The photolithography system of claim 1, wherein the mask girder has a mask girder rail with a lengthwise direction across the at least one main rail, and the mask hoist is coupled with the mask girder rail and movable substantially along the lengthwise direction of the mask girder rail.

4. The photolithography system of claim 1, wherein the second overhead crane comprises:
a unit girder coupled with the main rail and movable at least between the second position above the photolithography machine and the third position; and
a unit hoist movably coupled with the unit girder, wherein the unit holding device is coupled with the unit hoist.

5. The photolithography system of claim 4, wherein the unit girder has a unit girder rail with a lengthwise direction across the at least one main rail, and the unit hoist is coupled with the unit girder rail and movable substantially along the lengthwise direction of the unit girder rail.

6. The photolithography system of claim 4, wherein a rated load of the combination of the unit girder, the unit hoist, and the unit holding device is greater than the removable unit.

7. The photolithography system of claim 4, wherein a rated load of the combination of the unit girder, the unit hoist, and the unit holding device is greater than a rated load of the combination of the mask girder, the mask hoist, and the mask holding device.

8. The photolithography system of claim 1, wherein the at least one photolithography machine has the removable unit therein.

9. The photolithography system of claim 8, wherein the removable unit comprises at least one lens.

10. The photolithography system of claim 1, wherein a rated load of the combination of the mask girder, the mask hoist, and the mask holding device is greater than the at least one photo-mask.

11. A photolithography system, comprising:
at least one photolithography machine comprising a cover and a container below the cover, the cover being movable to expose an inner space inside the container;
a pair of main rails;
a first overhead crane comprising:
a mask girder positioned across the main rails and movable relative to the at least one photolithography machine;
a mask hoist movably coupled with the mask girder; and
a mask holding device coupled with the mask hoist;
a second overhead crane movably coupled to the main rails, the second overhead crane comprising a unit hoist and a unit holding device coupled with the unit hoist, wherein the unit hoist has a range of motion sufficient to lower the unit holding device into the exposed inner space of the photolithography machine;
a conveyor, wherein the main rails extend across the conveyor; and
a photo-mask stocker connected to the conveyor.

12. The photolithography system of claim 11, wherein the at least one photolithography machine is positioned below a gap between the main rails.

13. The photolithography system of claim 11, wherein a distance between the pair of main rails is substantially constant along a lengthwise direction of at least one of the pair of main rails.

14. The photolithography system of claim 11, wherein the pair of main rails are arranged in a substantially parallel manner.

15. The photolithography system of claim 11, wherein the mask girder comprises a pair of wheels respectively rollably received in the pair of main rails.

16. The photolithography system of claim 11, wherein the mask girder has a mask girder rail between the pair of main rails, and the mask hoist is coupled with the mask girder rail and movable substantially along a direction that is non-parallel to a lengthwise direction of at least one of the pair of main rails.

17. The photolithography system of claim 11, wherein the mask girder has a mask girder rail with a lengthwise direction across the pair of main rails, and the mask hoist is coupled with the mask girder rail and movable substantially along the lengthwise direction of the mask girder rail.

18. The photolithography system of claim 11, wherein the mask hoist is configured to move the mask holding device along a direction substantially orthogonal to lengthwise directions of the mask girder and at least one of the pair of main rails.

19. The photolithography system of claim 11, wherein the second overhead crane further comprises:
a unit girder positioned across the pair of main rails and movable relative to the at least one photolithography machine and the mask girder,
wherein the unit hoist is movably coupled with the unit girder.

20. A photolithography system, comprising:
a photo-mask stocker;
a conveyor connected to the photo-mask stocker;
a plurality of main rails spanning the conveyor;
a photolithography machine comprising a cover and a container under the cover, the cover being movable to expose an inner space inside the container;
a first overhead crane spanning the main rails, the first overhead crane comprising:
a mask girder coupled with the main rails and movable at least between a position above the conveyor and a position above the photolithography machine;
a mask hoist movably coupled with the mask girder; and
a mask holding device coupled with the mask hoist; and
a second overhead crane spanning the main rails, the second overhead crane being movable into and out of the exposed inner space inside the container.

* * * * *